United States Patent
Kim et al.

(10) Patent No.: US 10,043,465 B2
(45) Date of Patent: Aug. 7, 2018

(54) DISPLAY DEVICE

(71) Applicant: SAMSUNG DISPLAY CO., LTD., Yongin, Gyeonggi-do (KR)

(72) Inventors: Kwi Hyun Kim, Suwon-si (KR); Young Goo Song, Asan-si (KR)

(73) Assignee: Samsung Display Co., Ltd. (KR)

( * ) Notice: Subject to any disclaimer, the term of this patent is extended or adjusted under 35 U.S.C. 154(b) by 66 days.

(21) Appl. No.: 14/680,810

(22) Filed: Apr. 7, 2015

(65) Prior Publication Data

US 2015/0213773 A1 Jul. 30, 2015

Related U.S. Application Data

(62) Division of application No. 12/900,195, filed on Oct. 7, 2010, now Pat. No. 9,035,922.

(30) Foreign Application Priority Data

May 12, 2010 (KR) .................. 10-2010-0044464

(51) Int. Cl.
*G09G 3/36* (2006.01)
*G11C 19/18* (2006.01)
(Continued)

(52) U.S. Cl.
CPC ......... *G09G 3/3648* (2013.01); *G09G 3/3614* (2013.01); *G09G 3/3674* (2013.01); *G09G 3/3677* (2013.01); *G09G 3/3688* (2013.01); *G11C 19/184* (2013.01); *G11C 19/28* (2013.01); *H01L 27/124* (2013.01); *H01L 27/1222* (2013.01); *H01L 27/1255* (2013.01); *H01L 29/78669* (2013.01); *H01L 29/78678* (2013.01);
(Continued)

(58) Field of Classification Search
CPC .... G11C 19/186; G11C 19/28; G09G 3/3674; G09G 2310/0286
See application file for complete search history.

(56) References Cited

U.S. PATENT DOCUMENTS

| 2008/0246739 A1 | 10/2008 | Choi et al. |
| 2009/0026463 A1 | 1/2009 | Kang et al. |
| 2009/0174690 A1* | 7/2009 | Song .................... G09G 3/3233 345/204 |

FOREIGN PATENT DOCUMENTS

| JP | 2003-046090 | 2/2003 |
| KR | 10-2003-0010873 | 2/2003 |

(Continued)

*Primary Examiner* — Dennis Joseph
(74) *Attorney, Agent, or Firm* — Innovation Counsel LLP

(57) ABSTRACT

A display device includes a driver circuit monolithically integrated in a display panel. The display panel has a plurality of pixel units and signal lines; and a driver circuit including a first circuit element and a second circuit element integrally formed on the display panel and electrically connected to each other, wherein patterning density of the first circuit element and patterning density of the second circuit element would be substantially different from each other if the first and second circuit elements were laid out as concentrated individual circuit elements, but where the driver layout includes at least two spaced apart first circuit element regions over which the first circuit element is distributively formed and the driver layout includes an interposed second circuit element region in which at least part of the second circuit element is formed.

11 Claims, 15 Drawing Sheets

(51) Int. Cl.
*G11C 19/28* (2006.01)
*H01L 27/12* (2006.01)
*H01L 29/786* (2006.01)

(52) U.S. Cl.
CPC ............... *G09G 2300/0408* (2013.01); *G09G 2300/0426* (2013.01); *G09G 2300/0842* (2013.01); *G09G 2310/0286* (2013.01); *G09G 2360/16* (2013.01)

(56) References Cited

FOREIGN PATENT DOCUMENTS

| | | |
|---|---|---|
| KR | 10-2007-0096571 | 10/2007 |
| KR | 10-2008-0104726 | 12/2008 |
| KR | 10-2009-0011261 | 2/2009 |
| KR | 10-2009-0075494 | 7/2009 |

\* cited by examiner

FIG.13

| TA | CA | TA | CA | TA | CA | TA |

DISPLAY DEVICE

CROSS-REFERENCE TO RELATED APPLICATION

This application is a divisional application of U.S. patent application Ser. No. 12/900,195 filed on Oct. 7, 2010, which claims priority to and the benefit of Korean Patent Application No. 10-2010-0044464 filed in the Korean Intellectual Property Office on May 12, 2010, the entire contents of which application are incorporated herein by reference.

BACKGROUND (a) Field of Disclosure

The present disclosure of invention relates to a display device, and more particularly to a layout structure of an integrated display device having a driver circuit monolithically integrated in a display panel thereof.

(b) Description of Related Technology

As one of widely used image display devices, the liquid crystal display (LCD) device is one that generally includes two display panels each provided with field controlling electrodes such as pixel electrodes and a common electrode. A liquid crystal material layer is typically interposed between the two display panels. The LCD device displays images when voltages are applied to the field-generating electrodes to thereby generate corresponding electric fields in the LC layer, where the electric fields determine orientations of LC molecules therein and thus selectively adjust polarizations of incident light rays which polarized light rays are then further processed to form a desired image. As examples of display devices other than LCD ones, there are organic light emitting devices (OLEDs), plasma display devices, and electrophoretic display devices.

The LCD display device generally includes a display panel (a.k.a. TFT panel) including pixel units each with a respective switching circuit element (e.g., a thin film transistor or TFT), display signal lines, a gate driver that supplies gate signals to gate lines among the display signal lines so as to turn on/off desired ones of the switching circuit elements, a data driver for applying data voltages to data lines among the display signal lines, and a signal controller for controlling the above circuit elements.

The gate driver and the data driver circuits may be provided as individual IC chips mounted on the display device, or they may be mounted on a flexible printed circuit film as a tape carrier package (TCP) type and attached to the display device, or they may be mounted on a separate printed circuit board (PCB). Alternatively and particularly, the gate driver circuit may be monolithically integrated as part of the TFT display panel by forming the gate driver circuit with the same fabrication process steps as used for forming the display signal lines and the switching circuit elements (the TFTs).

When the gate driver circuit is thus directly integrated in the display panel, the circuit elements of the driver may be formed by a photolithographic patterning method using an exposure step and a developing step. Here, it is sometimes the case that a difference is present within the physical layout of various features (e.g., circuit elements) of the device so that some areas of the layout have finely pitched features (e.g., conductors with very narrow line widths) and other areas of the layout have less finely pitched features (e.g., conductors or electrodes with much larger line widths or alike dimensions). In other words, when the integrated circuitry is fabricated (by mass production means) the relative packing densities of neighboring circuit elements among the several circuit elements in the integrated circuit layout can be substantially different. More specifically, when the gate driver circuit is patterned, different portions thereof can have substantially different line or electrode widths or alike dimensions and the difference in respective pattern densities may influence patterning of the circuit elements, especially those having a relatively large patterning density (e.g., tightly packed and finely pitched layout features) as opposed to those having a substantially smaller patterning density (e.g., less tightly packed and more coarsely dimensioned or pitched layout features). For example, when a first circuit element having a relatively simple concentrated pattern such as that of a capacitor plate or electrode is disposed adjacent to other circuit elements having relatively complicated and finely pitched layout patterns such as gate and source electrodes of MOSFET transistors, a difference of concentration of a developing solution used when developing a corresponding photosensitive film (PR layer) after photolithographic exposure may cause overdevelopment (e.g., excessive etching) of the photosensitive film in areas where the other (finely pitched) circuit elements are provided and their more complicated patterns are disposed near the boundary portion between the different first and other patterns. Thus, the patterning of the finely pitched circuit elements of the driver circuit may be deteriorated such that a defect of the driver may be generated.

The above information disclosed in this Background section is only for enhancement of understanding of the background of the invention and therefore it may contain information that is not pre-recognized by and does not form part of the prior art that is already known to persons of ordinary skill in the pertinent art.

SUMMARY

A display device according to an exemplary embodiment includes: a display panel including a plurality of pixel units and signal lines operatively coupled to the pixel units; and a driver circuit having a first circuit element and a second circuit element formed on the display panel, and electrically connected to each other, wherein patterning density of the first circuit element and patterning density of the second circuit element would be substantially different from each other if the first and second circuit elements were formed individually as discrete elements, and where the first circuit element is distributively laid out over at least two spaced apart first circuit element regions, and at least a part of the second circuit element is formed in a corresponding second circuit element region that is interposed between the at least two first circuit element regions.

The first circuit element may include a transistor, and the second circuit element may include a capacitor that is electrically connected to the transistor.

The intermixed layouts of the first and second circuit elements is such that density of patterning is more smoothly distributed over the at least two spaced apart first circuit element regions and the interposed second circuit element region so that a more homogenous photolithographic development takes place when features of the first and second circuit elements are defined by a photolithographic development solution.

BRIEF DESCRIPTION OF THE DRAWINGS

FIG. 13 is a schematic diagram of a portion of a gate driver according to another exemplary embodiment of the present invention.

DETAILED DESCRIPTION

Figure 1:
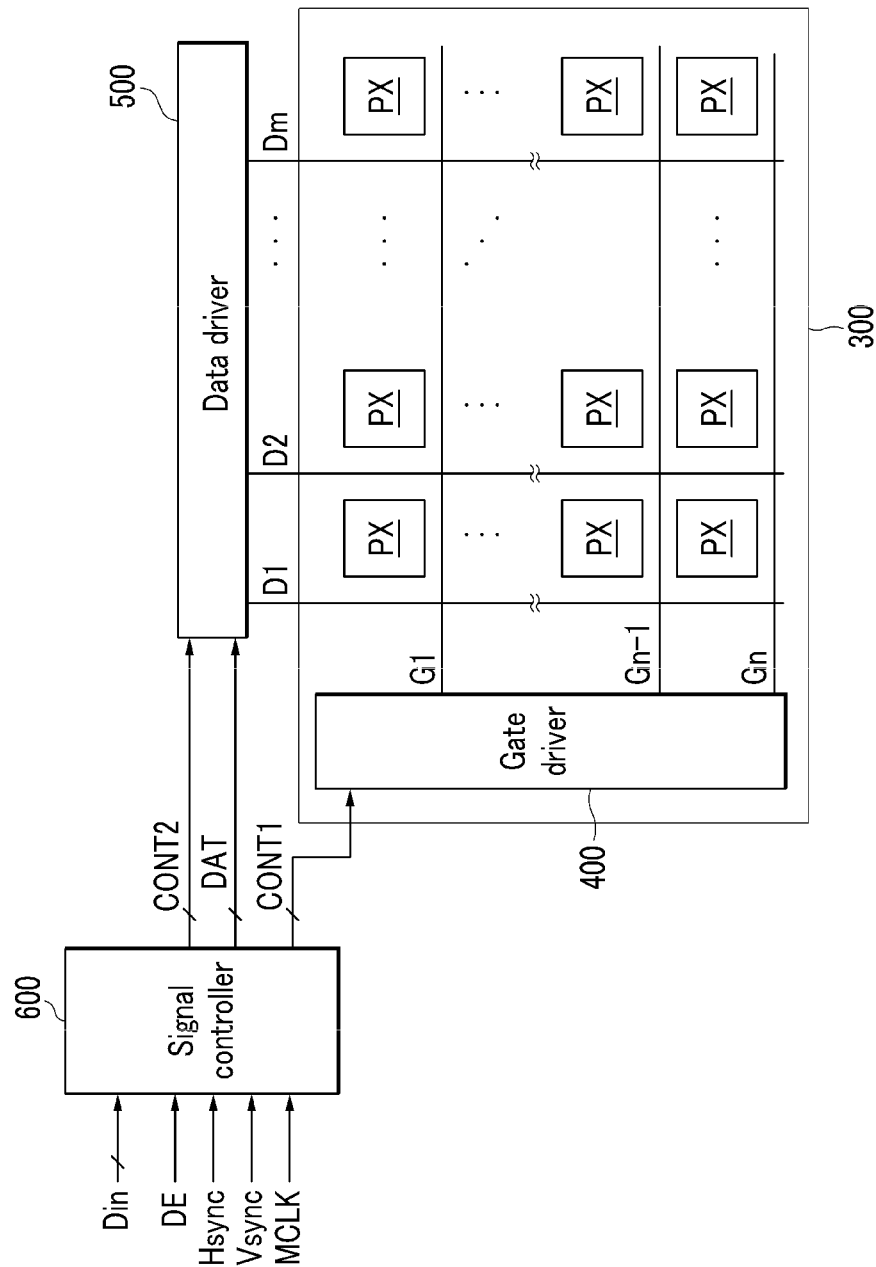
FIG. 1 is a block diagram of a display device that may be fabricated to have an integrated circuit layout in accordance with the present disclosure.

Embodiments in accordance with the present disclosure of invention will be described more fully hereinafter with reference to the accompanying drawings, in which examples are shown. As those skilled in the pertinent art would realize after reviewing this disclosure, the described embodiments may be modified in various different ways, all without departing from the spirit or scope of the present disclosure.

In the drawings, the thickness of layers, films, panels, regions, etc., are exaggerated for clarity. Like reference numerals designate like circuit elements throughout the specification. It will be understood that when an circuit element such as a layer, film, region, or substrate is referred to as being "on" another circuit element, it can be directly on the other circuit element or intervening circuit elements may also be present. In contrast, when a circuit element is referred to as being "directly on" another circuit element, there are no intervening circuit elements present.

Firstly, a display device structured according to an exemplary embodiment will be described with reference to introductory FIG. 1.

FIG. 1 is a block diagram of a display device according to an exemplary first embodiment.

Referring to FIG. 1, the illustrated display device includes a display panel 300, a gate driver 400 and a data driver 500 connected thereto, and a signal controller 600 providing control signals for controlling them.

In terms of an equivalent circuit, the display panel 300 may be seen to include a plurality of signal lines $G_1$-$G_n$, and $D_1$-$D_m$ and a plurality of pixel units PX arranged in an approximate matrix form with each pixel unit being connected to a respective crossing pair of a gate line among $G_1$-$G_n$ and a data line among $D_1$-$D_m$.

The illustrated plurality of gate lines G1 to Gn are used for transmitting corresponding gate signals (also referred to as "scanning signals") to respective rows of the pixel units (PX) and the illustrated plurality of data lines D1 to Dm are used for transmitting corresponding data voltages to respective columns of the pixel units (PX).

Each pixel unit PX includes a respective switching circuit element (not shown, but can be a respective thin film transistor or TFT) respectively connected to a crossing pair of the signal lines G1-Gn and D1-Dm.

The gate driver circuitry 400 is integrally formed on the panel 300 and connected to the gate lines G1 to Gn, and structured for applying corresponding gate signals to the gate lines G1 to Gn, where the gate signal waveforms are generated with combined use of a gate-turn-on voltage level Von and a gate-turn-off voltage level Voff received from a corresponding power supply (not shown). The gate driver circuit 400 is basically an elongated shift register disposed alongside the panel 300 where the gate driver circuit 400 includes a plurality of shift-register-type stages respectively connected to adjacent ones of the gate lines. The integrally formed gate driver circuit 400 is fabricated with the same mass production fabrication process as used for the switching circuit elements (e.g., TFT's) of the pixel units PX of the display panel 300.

The data driver 500 is connected to the data lines D1-Dm of the display panel 300, and supplies corresponding data signal to respective ones of the data lines D1-Dm.

The signal controller 600 generates control signals (e.g., CONT1, CONT2) for controlling the gate driver 400 and the data driver 500.

Each of the data driver 500 and the signal controller 600 may be installed directly on the display panel assembly 300 in the form of a respective at least one monolithically integrated circuit chip. Alternatively, each of the drivers 500 and 600 may be installed on a flexible printed circuit film (not shown) to be attached to the thin film transistor array panel 300 in the form of a tape carrier package (TCP) or installed on a separate printed circuit board (not shown). As a further alternative, and like the gate driver 300, they may be directly integrated on the thin film transistor array panel 300 along with the signal lines G1-Gn and D1-Dm and the switching element.

Now, the operation of the above-described display device will be described in detail.

The signal controller 600 is supplied with digital input image signals Din and input control signals for controlling the display thereof from an external graphics controller (not shown). The input control signals include a vertical synchronization signal Vsync, a horizontal synchronization signal Hsync, a main clock signal MCLK, and a data enable signal DE.

On the basis of the input control signals and the input image signals Din, the signal controller 600 processes the image signals Din to be suitable for the operation of the thin film transistor (TFT) array panel 300 and generates corresponding gate control signals CONT1 and data control signals CONT2. The signal controller 600 sends the gate control signals CONT1 to the gate driver 400 and sends the processed image signals DAT and the data control signals CONT2 to the data driver 500.

The gate control signals CONT1 include a scanning start signal STV for instructing the gate driver 400 to start a scanning operation thereof, and at least one clock signal for controlling the period of gate-on voltage Von levels output as part of the scanning signals. The gate control signals CONT1 may further include at least one output enable signal OE for defining the duration of the gate-on voltage Von.

The data control signals CONT2 include a horizontal synchronization start signal STH for informing the data driver 500 of start of transmission of output image signals DAT of one pixel row, a load signal LOAD for instructing the data driver 500 to apply the data signals to the data lines D1-Dm, and a data clock signal HCLK. The data control signals CONT2 further include a inversion signal RVS for selectively reversing the polarity of the voltages of the data signals with respect to the common voltage Vcom (hereinafter, "the polarity of the voltages of the data signals with respect to the common voltage" is abbreviated to "the polarity of the data signals").

In response to the data control signals CONT2 from the signal controller 600, the data driver 500 receives the digital image signals DAT for each respective row of pixels, converts the digital image signals DAT into corresponding analog data voltages by selecting gray voltages corresponding to the respective digital image signals DAT, and applies the analog data signals to the data lines D1-Dm.

The gate driver 400 generates and applies a time-varying gate signal having the gate-on voltage Von as one of its levels to the gate lines G1-Gn in response to the scanning control signals CONT1 from the signal controller 600, thereby selectively turning on and in their successive time slots, the switching circuit elements connected to the gate lines G1-Gn. When a row of pixel units PX is selected by the gate driver 400, the data signals applied to the data lines D1-Dm are correspondingly supplied to the pixel units PX of the turned on row through the respectively turned-on switching circuit elements.

By repeating this procedure by a unit of a horizontal period (also referred to as "1H" and that is equal to one period of the horizontal synchronization signal Hsync and the data enable signal DE), all gate lines G1-Gn are sequentially supplied with the gate-on voltage Von, thereby applying respective data signals to all pixel units PX one row at a time to thereby display a desired image for one frame.

When the next frame starts after one frame finishes, the inversion signal RVS is typically applied to the data driver 500 and is controlled such that the polarity of the data signals is reversed (which is referred to as "per frame inversion"). The inversion signal RVS may also be controlled such that the polarities of the data signals flowing in a data line are periodically reversed during one frame (for example, per row inversion or dot inversion), or the polarity of the data signals in one packet are reversed (for example column inversion and dot inversion).

Next, further circuit details of a gate driver according to an exemplary embodiment will be described with reference to FIG. 2 to FIG. 4. In the present exemplary embodiment, the circuitry of a specific gate driver 400 is described, however the present disclosure is not limited to that specific circuitry and it is described merely for purposes of illustration.

Figure 2:
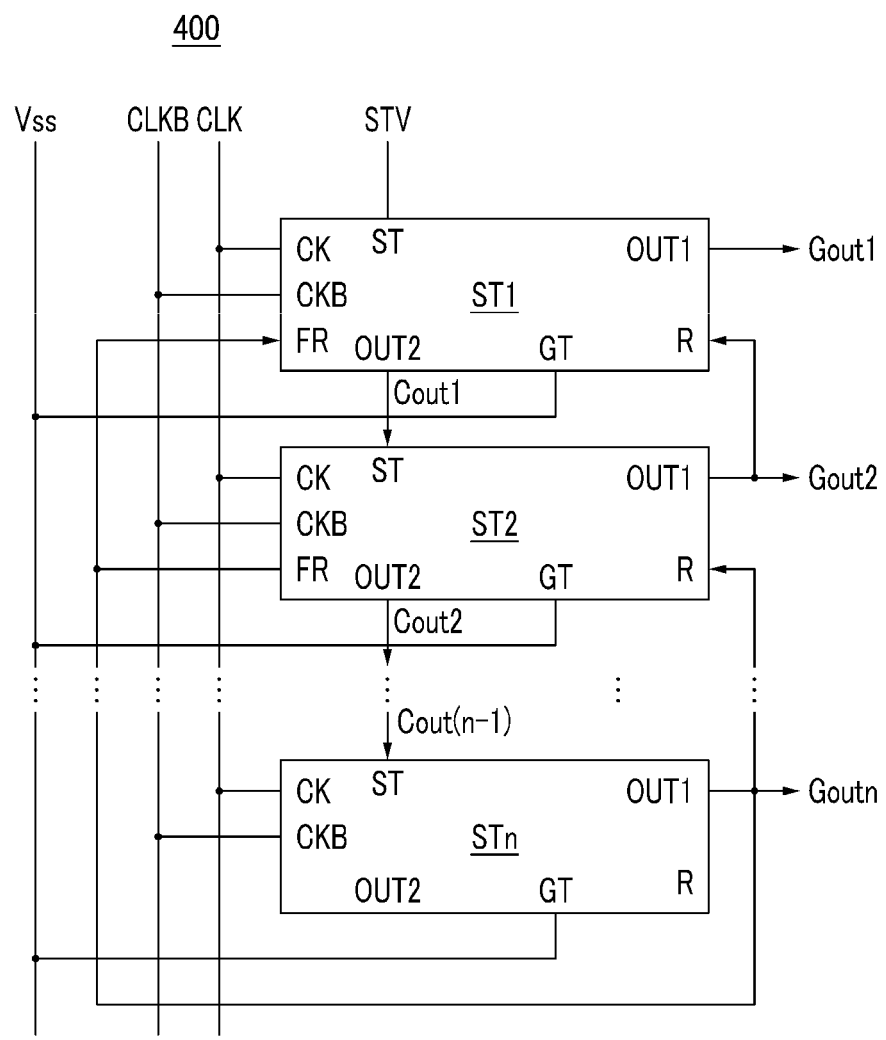
FIG. 2 is a block diagram showing in more detail the circuitry of a gate driver portion of the display device illustrated in FIG. 1.

FIG. 2 is a block diagram of a gate driver circuit 400 according to an exemplary embodiment. FIG. 3 is one example of more detailed circuitry useable as one or repeated stages of the gate driver circuit 400 of FIG. 2. FIG. 4 is an enlarged view of a portion Aex in the gate driver circuitry shown in FIG. 3.

Figure 3:
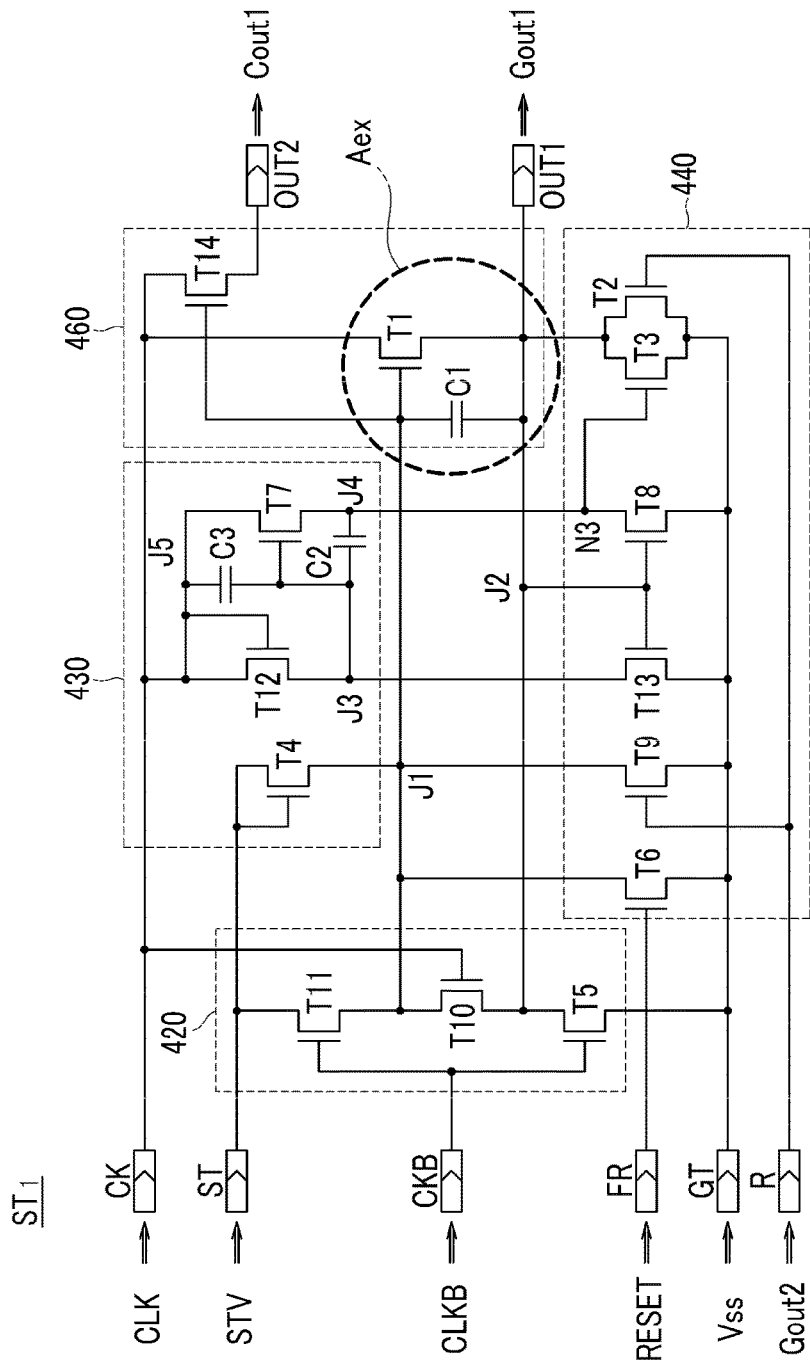
FIG. 3 is yet a more detailed circuit diagram of one stage of the gate driver portion of FIG. 2.

Referring to FIG. 2 and FIG. 3, the gate driver 400 according to an exemplary embodiment has input terminals connected to receive a common voltage Vss, first and second clock signals CLK and CLKB, a scanning start signal STV, and a reset signal RESET. The reset signal RESET may be omitted. The first and second clock signals CLK and CLKB may have a phase difference of 180°, a high level thereof may be a gate-on voltage Von, and a low level thereof may be a gate-off voltage Voff for turning off the switching circuit element.

The gate driver 400 includes a plurality of stages ST1, ST2, . . . , and STn, and each of the stages ST1, ST2, . . . , and STn has a set terminal ST, a common voltage terminal GT, two clock terminals CK and CKB, a reset terminal R, a frame reset terminal FR, a gate output terminal OUT1, and a carry output terminal OUT2. However, as shown in FIG. 2, the final stage STn may not have the frame reset terminal.

The clock terminals CK and CKB of each stages ST1, ST2, . . . , STn are supplied with the first and second clock signals CLK and CLKB, and the common voltage terminal GT is supplied with the common voltage Vss. The gate output terminal OUT1 of each stage ST1, ST2, . . . , STn outputs the gate outputs Gout1, Gout2, . . . , Goutn, and the carry output terminal OUT2 of the stages ST1, ST2, . . . , ST(n−1) except for the final stage STn outputs carry outputs Cout1, Cout2, . . . , Cout(n−1).

On the other hand, the set terminal ST of the first stage ST1 is input with the scanning start signal STV, and the set terminals ST of the remaining stages ST2, ST3, . . . , STn are input with the carry output of the previous stages ST1, ST2, . . . , ST(n−1), that is, the previous carry outputs Cout1, Cout2, . . . , Cout(n−1). The reset terminal R of the stages ST1, ST2, . . . , ST(n−1) except for the final stage STn is input with the gate output of the following stages ST2, ST3, . . . , STn, that is, the following gate outputs Gout2, Gout3, . . . , Goutn.

Referring to FIG. 3, each stage of the gate driver 400 according to an exemplary embodiment, as exemplified by the first stage ST1, includes an input section 420, a pull-up driver 430, a pull-down driver 440, and an output unit 460. The illustrated circuitry includes thin film transistors T1-T14. The pull-up driver 430 and the output unit 460 further include capacitors C1-C3. Also, the thin film transistors T1-T14 may be NMOS transistors or PMOS transistors. Further, the capacitors C1-C4 may be implemented as intentional parasitic capacitances of desired magnitudes induced between a gate and either a drain or a source of the associated transistor as formed during a manufacturing process.

The input section 420 includes three transistors T11, T10, and T5 that are sequentially coupled in series to the set terminal ST and the common voltage terminal GT. The gates of the transistors T11 and T5 are connected to the clock terminal CKB, and the gate of the transistor T10 is connected to the clock terminal CK. A junction between the transistor T11 and the transistor T10 is connected to a junction J1, and a junction between the transistor T10 and the transistor T5 is connected to a junction J2.

The pull-up driver unit 430 includes a transistor T4 connected between the set terminal ST and the junction J1, a transistor T12 connected to the clock terminal CK and the junction J3, and a transistor T7 connected between the clock terminal CK and the junction J4. The gate and drain of the transistor T4 are commonly connected to the set terminal ST, the source thereof is connected to the junction J1, the gate and the drain of the transistor T12 are commonly connected to the clock terminal CK, and the source thereof is connected to the junction J3. The gate of the transistor T7 is connected to the junction J3 and is simultaneously connected to the clock terminal CK through the capacitor C1, the drain thereof is connected to the clock terminal CK, the source thereof is connected to the junction J4, and the capacitor C2 is connected between the junction J3 and the junction J4.

The pull-down driver 440 includes a plurality of transistors T6, T9, T13, T8, T3, and T2 receiving the common voltage Vss through the source, and outputting it to the junctions J1, J2, J3, and J4 through the drain. The gate of the transistor T6 is connected to the frame reset terminal FR, the drain thereof is connected to the junction J1, the gate of the transistor T9 is connected to the reset terminal R, and the drain thereof is connected to the junction J1, and the gates of the transistors T13 and T8 are commonly connected to the junction J2 and the drains thereof are respectively connected to the junctions J3 and J4. The gate of the transistor T3 is connected to the junction J4, the gate of the transistor T2 is connected to the reset terminal R, and the drains of two transistors T3 and T2 are connected to the junction J2.

The output unit 460 includes a pair of transistors T1 and T14 having a drain and a source that are respectively connected between the clock terminal CK, and the output terminals OUT1 and OUT2, and a gate connected to the junction J1, and a capacitor C3 connected between the gate and the drain of the transistor T1, that is, between the junction J1 and the junction J2. The source of the transistor T1 is also connected to the junction J2.

Figure 4:
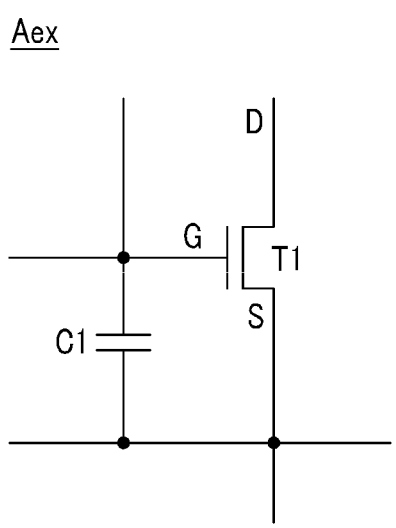
FIG. 4 is an enlarged view of a portion Aex in the gate driver shown in FIG. 3.

Referring to FIG. 4, for the illustrated partial circuit element of the gate driver 400, for example, the combination of transistor T1 and capacitor C1 of the output unit 460, two of the terminals of the capacitor C1 are respectively connected to the gate region G and the source region S of the transistor T1. When patterning these circuit elements on the display panel 300, the semiconductor portion of transistor T1 (which has the source, drain and channel regions finely defined therein) tends to have a feature patterning of a relatively high density (e.g., finely pitched) as compared with the conductive plates of capacitor C1. That is, a composite layout pattern having a high ratio of largest feature area to smallest feature area is to be formed by etching or otherwise removing blanket deposited conductive material (e.g., gate lines and source lines) through use of mass production patterning techniques, and these finely pitched versus coarsely pitched features are disposed adjacent to each other. Hereafter, "density of patterning" means the ratio of the area of the portion that is to be removed by patterning versus the entire area of the corresponding circuit element or layout feature.

As described above, among the circuit elements adjacent to each other in the driver integrated in the display panel 300, the arrangement of the circuit element (e.g., transistor T1) having the high patterning density and the circuit element (e.g., unitary capacitor C1) having the comparatively low patterning density will be described with reference to FIG. 5, FIG. 6, and FIG. 13 as well as FIG. 1 to FIG. 4.

In the present exemplary embodiment, the transistor T1 and the capacitor C1 included in the output unit 460 of the gate driver 400 will be described as an example, however, the present teachings are not limited thereto.

Figure 5:
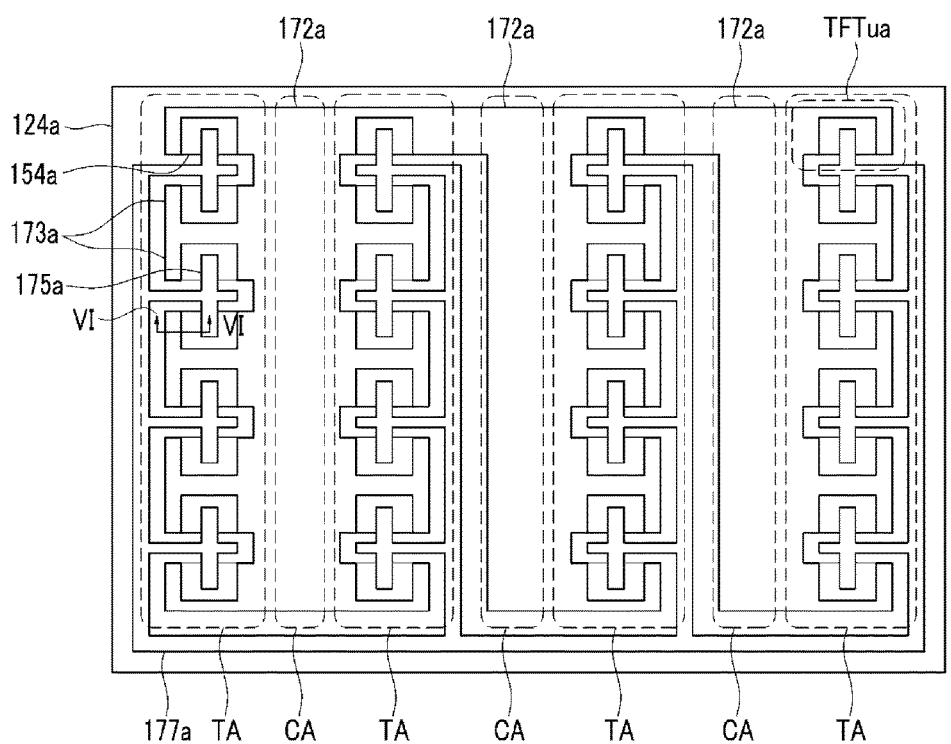
FIG. 5 is a plan view of a layout of a portion of a gate driver that is fabricated in accordance with the present disclosure so as to have smoothly distributed mixtures of finely pitched features and coarser features.

FIG. 5 is a layout view of a portion of a gate driver according to an exemplary embodiment. FIG. 6 is a cross-sectional view of the gate driver of FIG. 5 taken along the line VI-VI. FIG. 13 is a schematic diagram of a portion of a gate driver according to another exemplary embodiment of the present invention.

Figure 6:
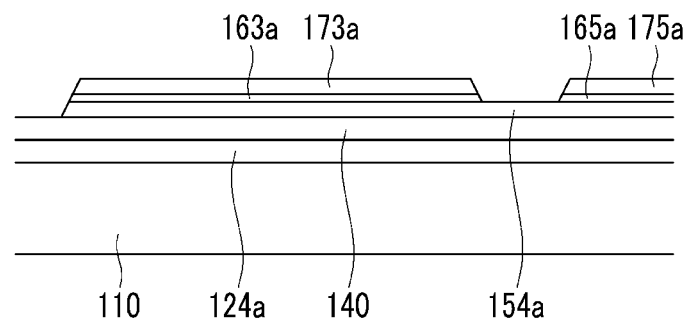
FIG. 6 is a cross-sectional view of the gate driver of FIG. 5 taken along the line VI-VI.

Firstly, referring to FIG. 5 and FIG. 6, a gate electrode layer 124a is formed on an insulation substrate 110 made of a transparent insulator such as glass or plastic. The gate electrode layer 124a transmits gate signals and has a substantially polygonal shape when view from above (FIG. 5).

A gate insulating layer 140 made for example of a silicon nitride (SiNx) or a silicon oxide (SiOx) is formed on the gate electrode layer 124a.

A semiconductive layer (not shown) made for example of a hydrogenated amorphous silicon (referred to as "a-Si") or a polysilicon is formed on the gate insulating layer 140. The semiconductive layer, when viewed in the plan view of FIG. 5, includes a plurality of longitudinal portions (not referenced) and a plurality of protrusions 154a protruding from right and left sides from the respective longitudinal portions.

A pair of ohmic contact layers (not shown) that are separated from each other are formed on the semiconductive layer. One ohmic contact layer includes a plurality of longitudinal portions (not shown) having substantially the same shape as the longitudinal portions of the semiconductive layer, and a plurality of ohmic contacts 163a protruded in right and left sides from the longitudinal portions. The other ohmic contact layer includes a plurality of ohmic contacts 165a facing the ohmic contacts 163a. The plurality of ohmic contacts 163a are connected to each other or are connected to the longitudinal portions, and the plurality of ohmic contacts 165a are connected to each other.

The ohmic contact layers may be made of a material such as n+ hydrogenated amorphous silicon into which an n-type impurity such as phosphorus is doped with a high concentration, or of a conductive silicide.

A data conductor layer is formed on the ohmic contact layer. The data conductor layer includes a plurality of source electrodes 173a, a plurality of source expansions 172a, and a plurality of drain electrodes 175a.

Each source expansion 172a extends in the longitudinal direction and is disposed on the longitudinal portion of the semiconductive layer and the ohmic contact layer. The source expansion 172a has substantially the same shape as the longitudinal portion of the semiconductive layer and the ohmic contact layer.

The source electrode 173a is connected to the source expansion 172a and extends in the right and left sides of the source expansion 172a. The source electrodes 173a that are directly adjacent to each other may be directly connected to each other. The source electrode 173a has substantially the same shape as the ohmic contact 163a. Stated in other words, in FIG. 5, the source expansions 172a appear as vertical strips each in a respective capacitor area (CA) and the source electrodes 173a appear as capital T-shaped protrusions extending contiguously from the left and right sides of the vertically elongated source expansions 172a.

The drain electrode 175a is spaced apart from the source electrode 173a and the source expansion 172a. Each drain electrode 175a in FIG. 5 has a lower-case t-shape extending from a connection strip 177a such that the lower-case t-shape of substantially every drain electrode 175a comes to be disposed in spaced apart but facing relation with stems of two adjacent and capital T-shaped source electrodes 173a. The spacings in FIG. 5 between the capital T-shaped source electrodes 173a and the lower-case t-shaped drain electrodes 175a are where the transistor channel portions of the semiconductive layer form so as to be controlled by the underlying gate electrode 124a. As mentioned, all the drain electrodes 175a are connected to each other through connection strip 177a. The drain electrode 175a and the connection 177a have substantially the same shape as the plurality of ohmic contacts 165a.

The ohmic contacts 163a and 165a only exist between the underlying protrusions 154a of the semiconductive layer and the overlying data conductors thereby reducing contact resistance therebetween.

Although the various features in the illustrated layout of FIG. 5 are distributed so as to have less disparity in the overall density of patterning, nonetheless a capacitor C1 between source and gate is formed and a transistor having the source and gate as well as a drain is formed. More specifically, the gate electrode 124a, the source electrode 173a, and the drain electrode 175a form a thin film sub-transistor unit TFTua along the protrusion 154a of the semiconductive layer, and the channel of the unit transistor is formed in the protrusion 154a of the semiconductive layer between the source electrode 173a and the spaced apart drain electrode 175a. All the distributed unit sub-transistors TFTua of FIG. 5 are connected to each other thereby to form one transistor T1. The gate electrode 124a forms the gate G of the transistor T1, the plurality of source electrode 173a form the source S of the transistor T1, and the plurality of drain electrodes 175a form the drain D of the transistor T1.

Also, the gate electrode layer 124a and the plurality of source expansions 172a of the data conductor layer that are spaced apart from but overlap the gate electrode 124a, with the gate insulating layer 140 interposed therebetween as a dielectric layer, form one capacitor C1. The capacitor C1 may maintain the voltage difference of the gate G and the source S of the transistor T1, and the noise of the output signal may thus be suppressed.

As mentioned, the exposed protrusion 154a of the semiconductive layer includes a portion that is not covered by the data conductor layer and the ohmic contact layer between the source electrode 173a and the drain electrode 175a. The semiconductive layer except for the channel portion between the source electrode 173a and the drain electrode 175a has almost the same plane shape as the data conductor layer and the ohmic contact layer. Also, the ohmic contact layer has substantially the same plane shape and outer shape as the data conductor layer.

Figure 13:
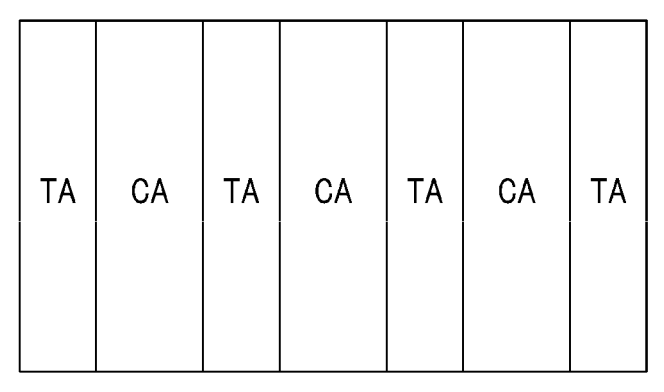

Referring to FIG. 5 and FIG. 13, the plurality of sub-transistor units TFTua form a plurality of transistor columns. The region where each transistor column is positioned is referred to as a transistor region TA. A capacitor region CA forming the capacitor C1 is disposed between the transistor regions TA.

As described above, the structure of one transistor T1 is subdivided into a plurality of spaced apart transistor regions TA and the structure of one capacitor C1 is distributively formed in regions between the spaced apart transistor regions TA. In other words, the structure of the one capacitor C1 occupies at least one capacitor area CA that is embraced between two transistor areas, TA and TA. The TA and CA areas are alternately disposed in the row direction or the column direction such that the structure of the transistor T1 has a relatively high patterning density, that is, it has a relatively high ratio as between the area of the portion that is removed through patterning and the entire area of the feature. Although, and the overall structure the capacitor C1 has a relative low patterning density, because the CA areas are alternately mixed with the TA areas, the disparity of patterning density is less concentrated in the distributed layout design of FIG. 5.

In FIG. 5 and differently from the exemplary embodiment shown in FIG. 13, the region forming one transistor area TA may be seen as being surrounded by at least two spaced apart capacitor regions CA such that the two regions TA and CA may be alternately disposed. In FIG. 5, each transistor area TA includes a plurality of sub-transistor units TFTua.

The number of transistor areas TA and the number of capacitor areas CA and the way they are distributively intermixed is not limited by the exemplary layout shown in either FIG. 13 or FIG. 5, and may be changed according to various design goals and conditions.

A manufacturing method for forming the intermixed transistor T1 and capacitor C1 structures according to an exemplary embodiment will be described with reference to FIG. 7 to FIG. 11 as well as FIG. 5 and FIG. 6.

Figure 7:
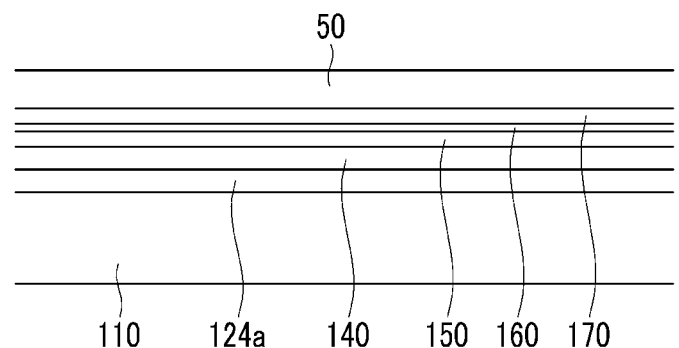
FIG. 7 to FIG. 11 are cross-sectional views showing an intermediate step in a manufacturing method of the gate driver shown in FIG. 5 and FIG. 6 according to an exemplary embodiment of the present invention.

Referring to FIG. 7, a gate electrode layer 124a is formed on an insulation substrate 110, and a gate insulating layer 140 is formed thereon. Next, an extrinsic semiconductor material composed of amorphous or crystallized silicon, a semiconductor material doped with an impurity, and a data conductive material are sequentially deposited on the gate insulating layer 140 to form an extrinsic semiconductive layer 150, a semiconductive layer 160 doped with the impurity, and a data conductive layer 170. Next, a photosensitive film 50 (PR or photoresist 50) is formed on the data conductive layer 170.

Figure 8:
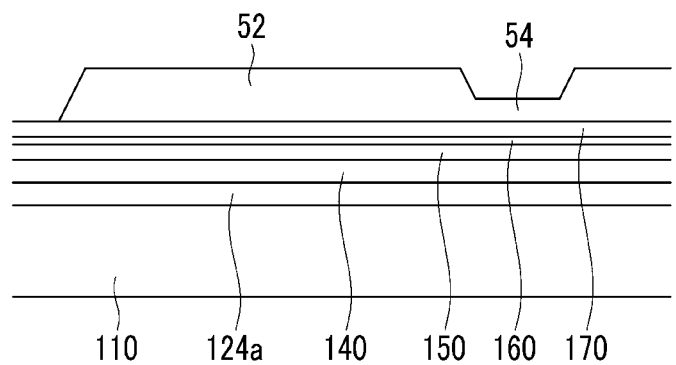

Next, as shown in FIG. 8, the photosensitive film 50 is exposed and developed by using a photomask (not shown) to form a photosensitive film pattern including a thick portion 52 and a thinner portion 54. Here, the concentration of the developing solution of the portion having the relative higher patterning density of the photosensitive film, that is, the relatively high area ratio of the portion that is removed or is developed through the patterning for the entire area, may be light compared with the concentration of the developing solution of the portion having the relatively low patterning density of the photosensitive film.

Figure 9:
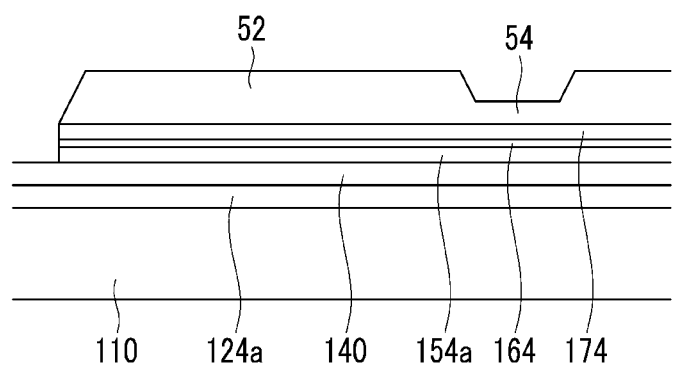

Next, as shown in FIG. 9, the extrinsic semiconductive layer 150, the semiconductive layer 160 doped with the impurity, and the data conductive layer 170 are etched by using the photosensitive film pattern of FIG. 8 as an etching mask through wet etching or dry etching to form a data conductor 174, an ohmic contact layer 164, and a semiconductive layer including a protrusion 154a that have the same plane shape.

Figure 10:
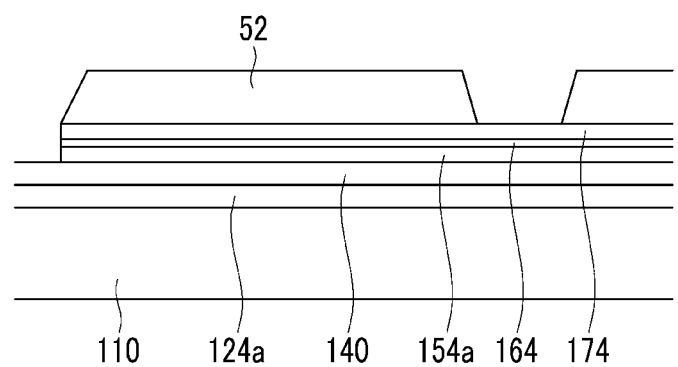

Next, referring to FIG. 10, the thin portion 54 of the photosensitive film pattern is removed. Here, the thickness of the thick portion 52 is reduced by the thickness of the thin portion 54. However, since the thick portion 52 of FIG. 9 is thicker than the thin portion 54 of FIG. 9, part of the hick portion 52 remains in FIG. 10.

Figure 11:
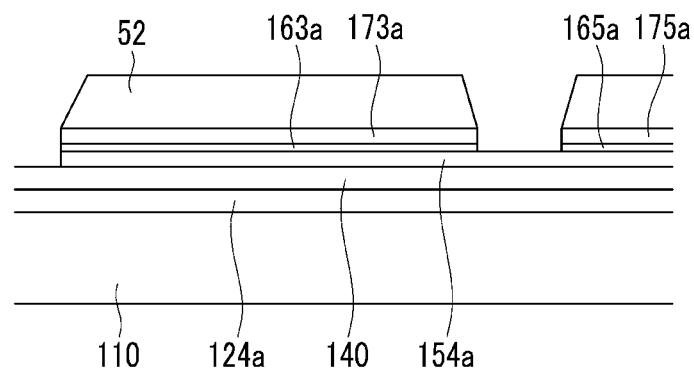

Next, as shown in FIG. 11, the data conductor layer 174 and the ohmic contact layer 164 are etched by using the developed photosensitive film pattern 52 of FIG. 10 as the etching mask to thereby form a data conductor layer including a source electrode 173a, a source expansion 172a, and a drain electrode 175a, and an ohmic contact layer including ohmic contacts 163a and 165a. Also, finally, as shown in FIG. 6, the remaining photosensitive film pattern 52 is removed.

As shown in FIG. 5 and FIG. 6, if the region TA of the transistor T1 having the relatively high patterning density, that is, the relatively high area ratio of the portion that is removed through the patterning, and the region CA of the capacitor C1 having the relatively low patterning density, may be alternately disposed, the concentration difference of the developing solution according to the difference of the patterning density of the photosensitive film 50 may be smooth when developing the photosensitive film 50. Accordingly, the deviation of the area or the thickness of the thin portion 54 of the photosensitive film pattern according to the transistor region TA may be prevented, and it is prevented that the thin portion 54 of the photosensitive film pattern is over-developed such that it (54) becomes too thin or entirely removed. Accordingly, the characteristic deviation of the transistor T1 may be reduced according to the position of the transistor region TA including the transistor T1, and the deterioration of the portion region of the transistor T1 may be prevented.

Next, an arrangement of a transistor T1 and a capacitor C1 of a gate driver according to another exemplary embodiment will be described with reference to FIG. 12. With respect to the same constituent circuit elements mentioned in the former exemplary embodiments, the same reference numerals are used and the same contents will be skipped.

Figure 12:
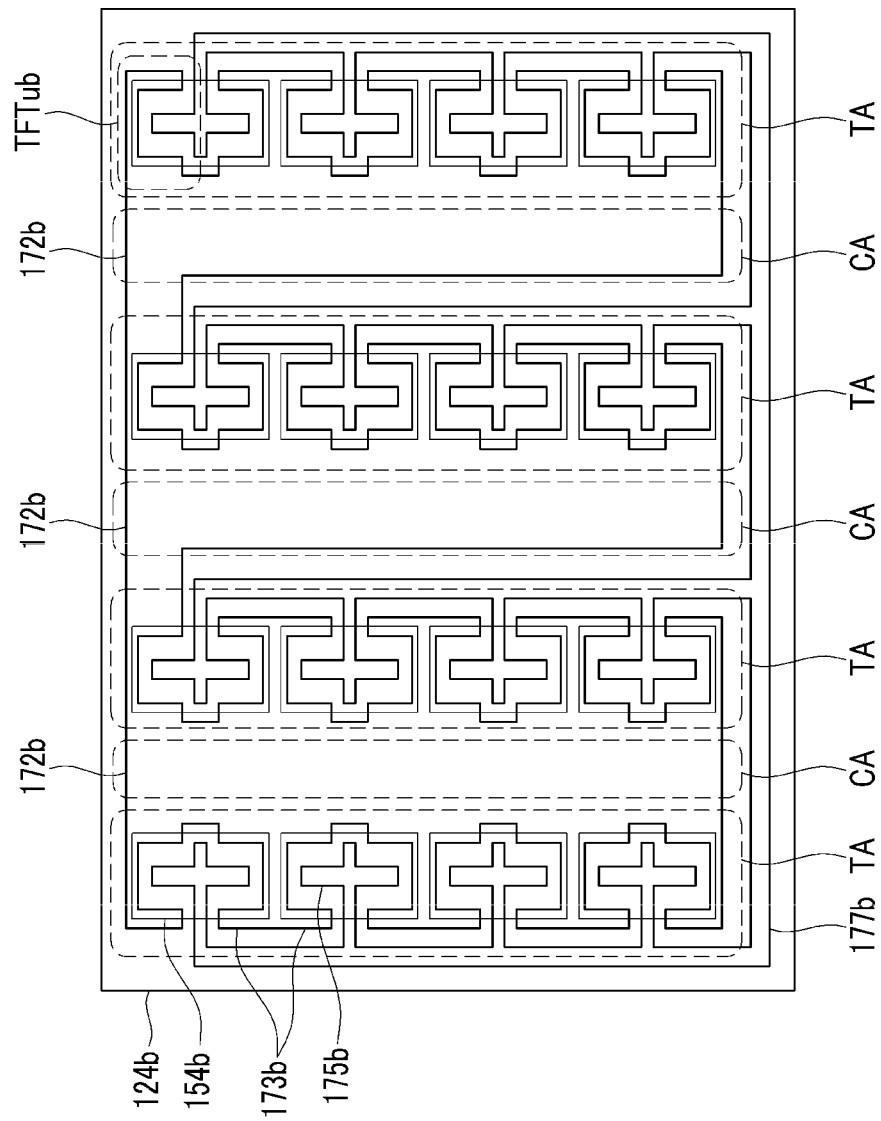
FIG. 12 is a layout view of a portion of a gate driver according to another exemplary embodiment of the present invention.

FIG. 12 is a top plan view of a layout of a portion of a gate driver according to another exemplary embodiment.

The exemplary embodiment shown in FIG. 12 except for the semiconductive layer has almost the same structure as the exemplary embodiment of FIG. 5 and FIG. 6.

A gate electrode 124b, a gate insulating layer 140, a plurality of spaced apart semiconductor islands 154b, a pair of ohmic contact layers (not shown), and a data conductor layer (not shown) including a source electrode 173b and a source expansion 172b connected to each other and a drain electrode 175b are sequentially formed on an insulation substrate 110.

Differently from the above exemplary embodiment of FIG. 5 and FIG. 6, a semiconductor island 154b overlapping the source electrode 173b and the drain electrode 175b facing each other is formed.

The gate electrode 124b, the source electrode 173b, and the drain electrode 175b form the sub-transistor unit TFTub along with the semiconductor 154b. As shown in FIG. 12, one semiconductor island 154b may overlap a portion of two source electrodes 173b and two drain electrodes 175b.

All unit transistors TFTub are connected to each other thereby forming one transistor T1 having one function. Also, the gate electrode 124b and the plurality of source expansions 172b overlapping the gate electrode 124b via the gate insulating layer 140 form one capacitor C1.

The semiconductor island 154b, and the data conductor layer and the ohmic contact layer, are formed by using an additional mask in the manufacturing method of the gate driver 400 according to the present exemplary embodiment. Also, the various characteristics and effects of the exemplary embodiment shown in FIG. 5 to FIG. 11 and FIG. 13 are applied to the exemplary embodiment shown in FIG. 12.

Figure 14:
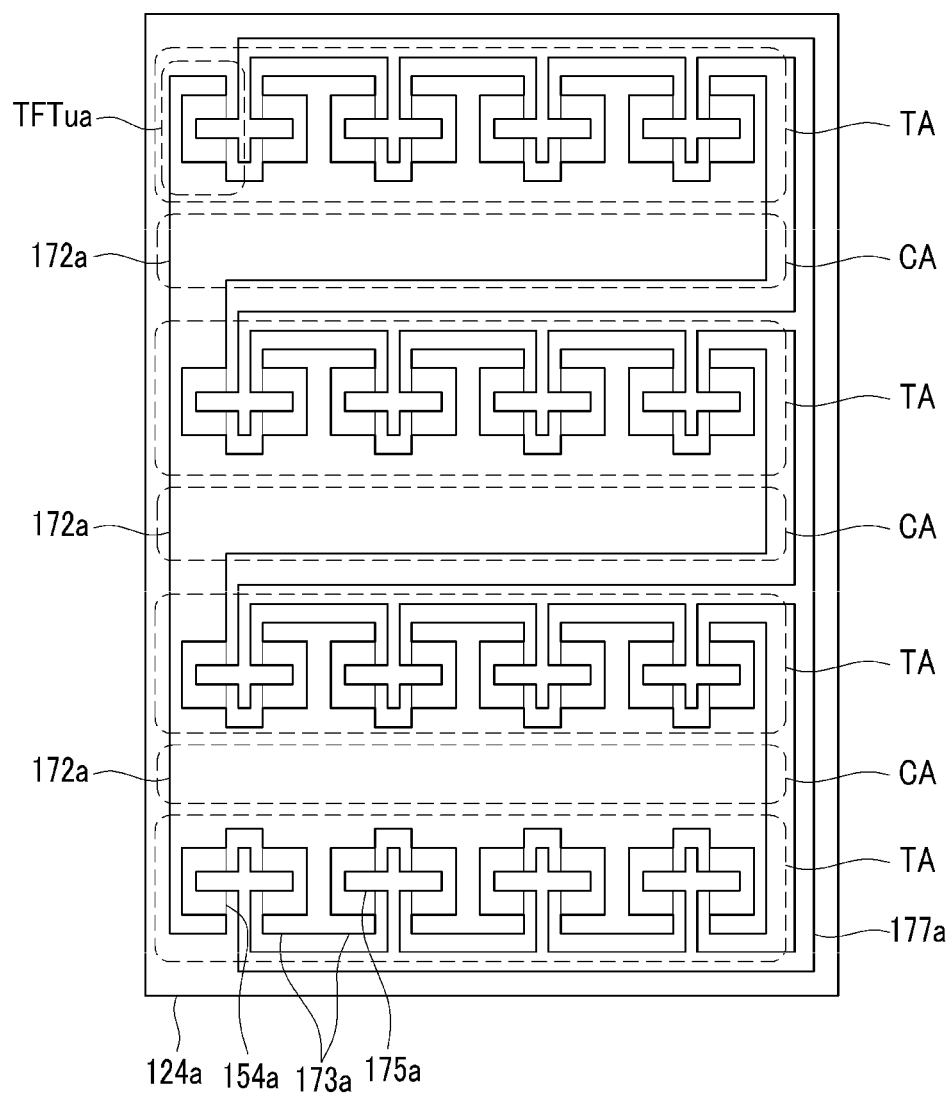
FIG. 14 is a layout view of a portion of a gate driver according to another exemplary embodiment of the present invention.

Next, the structure of the gate driver according to another exemplary embodiment will be described with reference to FIG. 14 and FIG. 15. Like reference numerals designate like circuit elements in the embodiment and the same description will be omitted. FIG. 14 is a layout view of a portion of a gate driver according to another exemplary embodiment and FIG. 15 is a schematic diagram of a gate driver according to the exemplary embodiment shown in FIG. 14.

The exemplary embodiment of FIG. 14 is almost the same as the exemplary embodiment shown in FIG. 5, except that each transistor area TA and capacitor area CA are elongated horizontally and are alternately disposed in the column direction in this embodiment.

Figure 15:
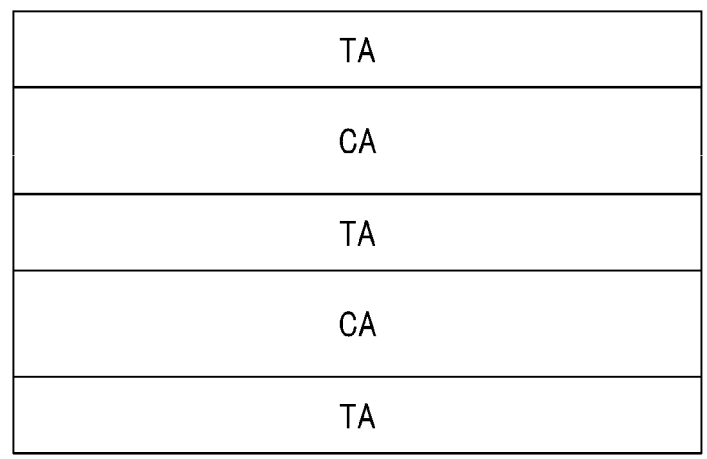
FIG. 15 is a schematic diagram of a gate driver according to the exemplary embodiment shown in FIG. 14, and FIG. 16, FIG. 17, and FIG. 18 are layout views of a portion of a gate driver according to another exemplary embodiment of the present invention.

Referring to FIG. 14 and FIG. 15, the unit transistor TFTua forming the transistor T1 of the gate driver 400 forms the plurality of transistor rows. The transistor region TA as the region where each transistor row is disposed extends in the row direction, and the capacitor region CA forming the capacitor C1 is formed between the neighboring transistor regions TA. The capacitor region CA also extends in the row direction.

That is, differently from the exemplary embodiment shown in FIG. 13, in the present exemplary embodiment, at least two transistor regions TA forming one transistor T1 and at least one capacitor region CA forming one capacitor C1 may be alternately disposed in the column direction. Alternatively, the region of one transistor T1 may be formed with at least one transistor region TA and the region forming one capacitor C1 may be divided into at least two capacitor regions CA, and the two regions TA and CA may be alternately disposed.

The number of transistor regions TA and the number of capacitor regions CA are not limited to the exemplary embodiment shown in FIG. 14 and FIG. 15, and may be changed according to the design conditions.

According to another exemplary embodiment of the present invention, the transistor T1 and the capacitor C1 may be realized by mixing the differently elongated and alternated structures of FIG. 13 and FIG. 15. That is, the portion that a plurality of transistor regions TA and a plurality of capacitor regions CA are alternately disposed in the row direction and the portion where they are alternately disposed may be formed together.

Next, a structure of a gate driver according to another exemplary embodiment will be described with reference to FIG. 16 and FIG. 17.

Figure 16:
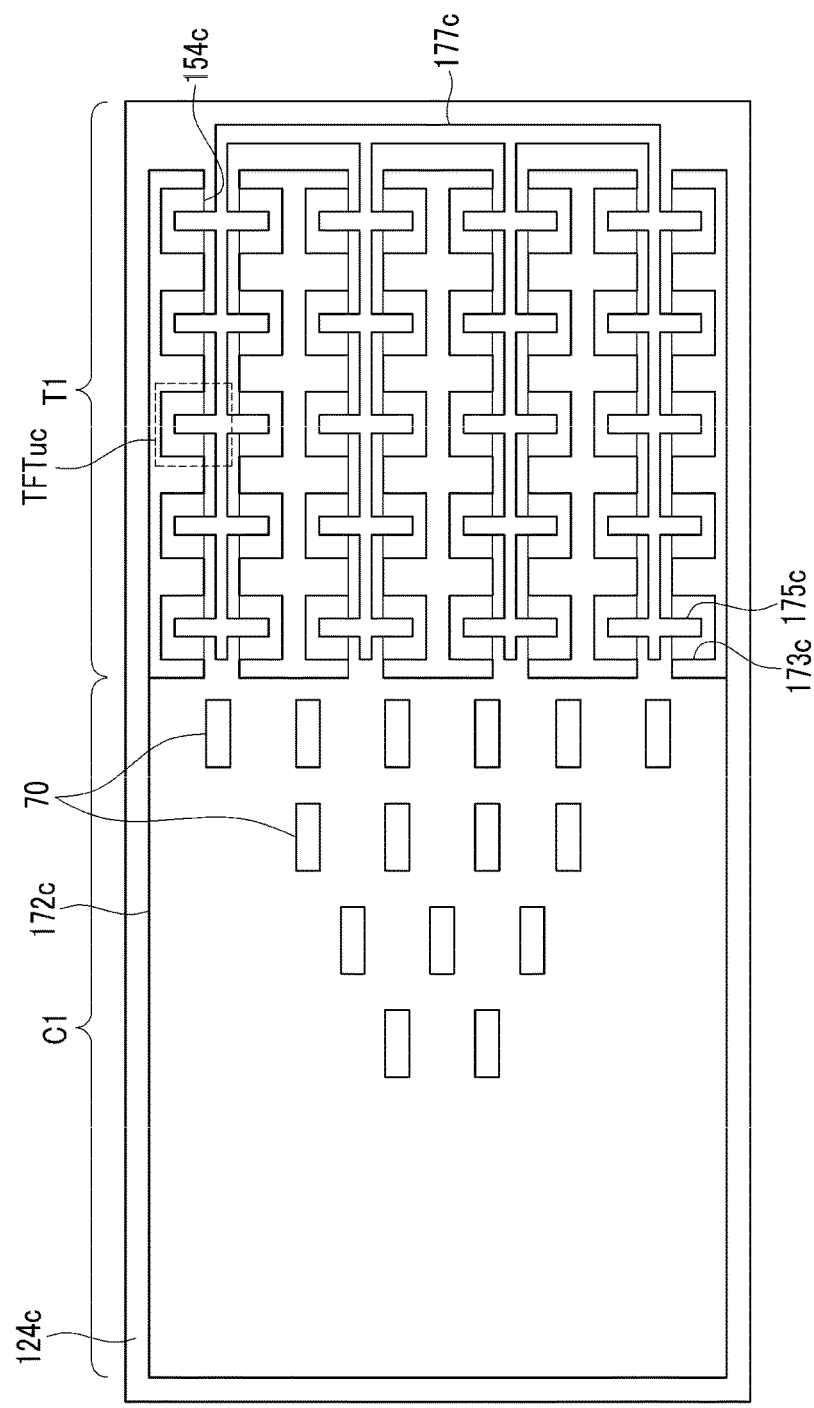
Figure 17:
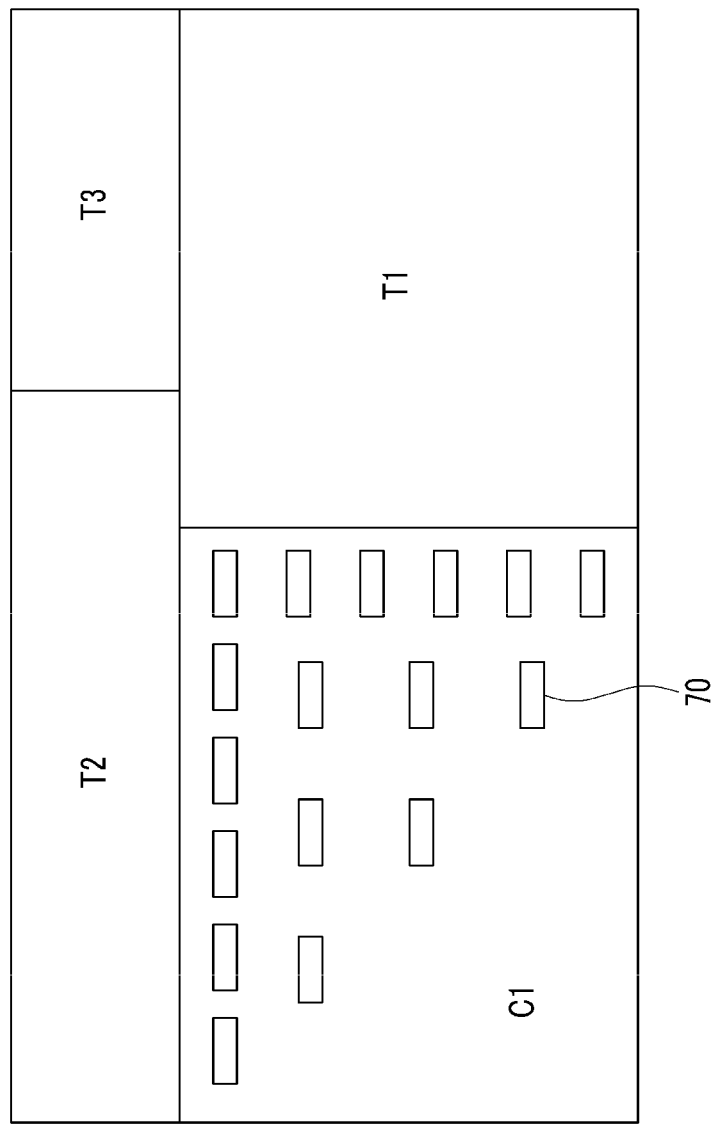

FIG. 16 and FIG. 17 are layout views of a portion of a gate driver according to another exemplary embodiment. The exemplary embodiment shown in FIG. 16 and FIG. 17 has almost the same layered structure as the exemplary embodiment shown in FIG. 5 and FIG. 6 except that here a smooth transition for one density of patterning to a substantially different density of patterning is provided.

A gate electrode 124c and a gate insulating layer 140 are sequentially formed on an insulation substrate 110.

A semiconductive layer (not shown) is formed on the gate insulating layer 140. The semiconductive layer includes one expansion (not shown) and a plurality of protrusions 154c protruded from one side of the expansion. The protrusions 154c may be disposed while forming a plurality of columns or rows. The expansion of the semiconductive layer may include a plurality of opening (not shown).

A pair of ohmic contact layers (not shown) separated from each other are formed on the semiconductive layer. One ohmic contact layer includes one expansion (not shown) having substantially the same shape as the expansion of the semiconductive layer, and a plurality of ohmic contacts (not shown) protruded from the expansion. The other ohmic contact layer includes a plurality of ohmic contacts (not shown) connected to each other. The expansions of the ohmic contact layer may include a plurality of openings (not shown).

A data conductor layer is formed on the ohmic contact layer. The data conductor layer includes a plurality of source electrodes 173c, a source expansion 172c, and a plurality of drain electrodes 175c.

The source electrode 173c is connected to the source expansion 172a and extends from one side of the source expansion 172c. The plurality of source electrodes 173c may be disposed while forming a plurality of rows, and the source electrodes 173c neighboring in one row are connected to each other.

The drain electrode 175c is separated from the source electrode 173c and the source expansion 172c. Each drain electrode 175c faces the source electrode 173c on the gate electrode 124c, and all drain electrodes 175c are connected to each other through connections 177c.

The source expansion 172c is positioned on the expansion of the semiconductive layer and the ohmic contact layer and has the substantially same shape as the expansion of the semiconductive layer and the ohmic contact layer. The outer of the source expansion 172c may have a polygonal shape such as an approximate quadrangle.

The gate electrode 124c, the source electrode 173c, and the drain electrode 175c form a unit transistor TFTuc along the protrusion 154c of the semiconductive layer, and all unit transistors TFTuc are connected to each other thereby forming one transistor T1 having one function. Also, the gate electrode 124c and the plurality of source expansions 172c overlapping the gate electrode 124c via the gate insulating layer 140 interposed therebetween form one capacitor C1. In the exemplary embodiment of FIG. 16, there is one region of the transistor T1, there is one region of the capacitor C1, and they are adjacent to each other and they merge smoothly into one another.

The semiconductive layer except for the channel portion between the source electrode 173c and the drain electrode 175c has almost the same plane shape as the data conductor layer and the ohmic contact layer. Also, the ohmic contact layer has substantially the same plane shape and outer shape as the data conductor layer.

Particularly, in the exemplary embodiment of FIG. 16, the source expansion 172c includes a plurality of openings 70, and the distribution density of the openings 70 changes relatively smoothly according to positions as between the left and right ends of the illustrated structure. That is, the distribution density of the plurality of openings 70 may be high as it comes gradually closer to the region of the transistor T1 and the distribution density thereof may be low as it gradually fades farther away from the transistor T1.

The shape of each opening 70 may have the various shapes such as polygon of a rectangle, a circle, or an oval. Also, the size of the openings 70 may be variously changed according to the design conditions. On the other hand, the openings included in the expansion of the semiconductive layer and the ohmic contact layer may be formed with the same shape as the openings 70 of the source expansion 172c at the same position.

In the present exemplary embodiment, the average density according to the position of the pattern of the region of the capacitor C1 including the opening 70 may be low compared with the patterning density of the region of the transistor T1.

As described above, when the region of the transistor T1 and the region of the capacitor C1 are adjacent to each other, as the data conductor layer forming the capacitor C1 has the relative small patterning density, the area ratio of the portion that is removed through the patterning for the entire area is close to the transistor T1, and the pattern such as the opening having the high density is formed such that the rapid difference of the density of the patternings may be reduced at the boundary between the region of the capacitor C1 and the region of the transistor T1. Accordingly, the rapid change of the concentration of the developing solution may be prevented in the mass production manufacturing method of the gate driver according to the exemplary embodiment of FIG. 7 to FIG. 11, and the deterioration of the transistor T1 and the characteristic deviation may be reduced.

Additionally, since the drains of the other transistors T2 and T3 of the gate driver circuit are also connected to C1, these other transistors T2 and T3 may be further formed in similar fashion as well as the transistor T1 near the region where the capacitor C1 is formed in the exemplary embodiment shown in FIG. 17. These transistors T2 and T3 may be the transistors T2 and T3 included in the pull-down driver 440 of the exemplary embodiment shown in FIG. 3.

In the present exemplary embodiment, the density of the opening 70 of the source expansion 172c is high close to the region of the transistor T1 and the region of the transistor T2 adjacent thereto in the upper direction. Accordingly, the rapid change of the patterning density, that is, the area ratio of the portion that is removed through the patterning for the entire area, may be prevented on the boundary of the region of the capacitor C1 and the other transistor T2 adjacent thereto in the upper direction. The present exemplary embodiment may be applied with the various characteristics and effects of the exemplary embodiment shown in FIG. 16.

Finally, a structure of a gate driver according to another exemplary embodiment of the present invention will be described with reference to FIG. 18.

Figure 18:
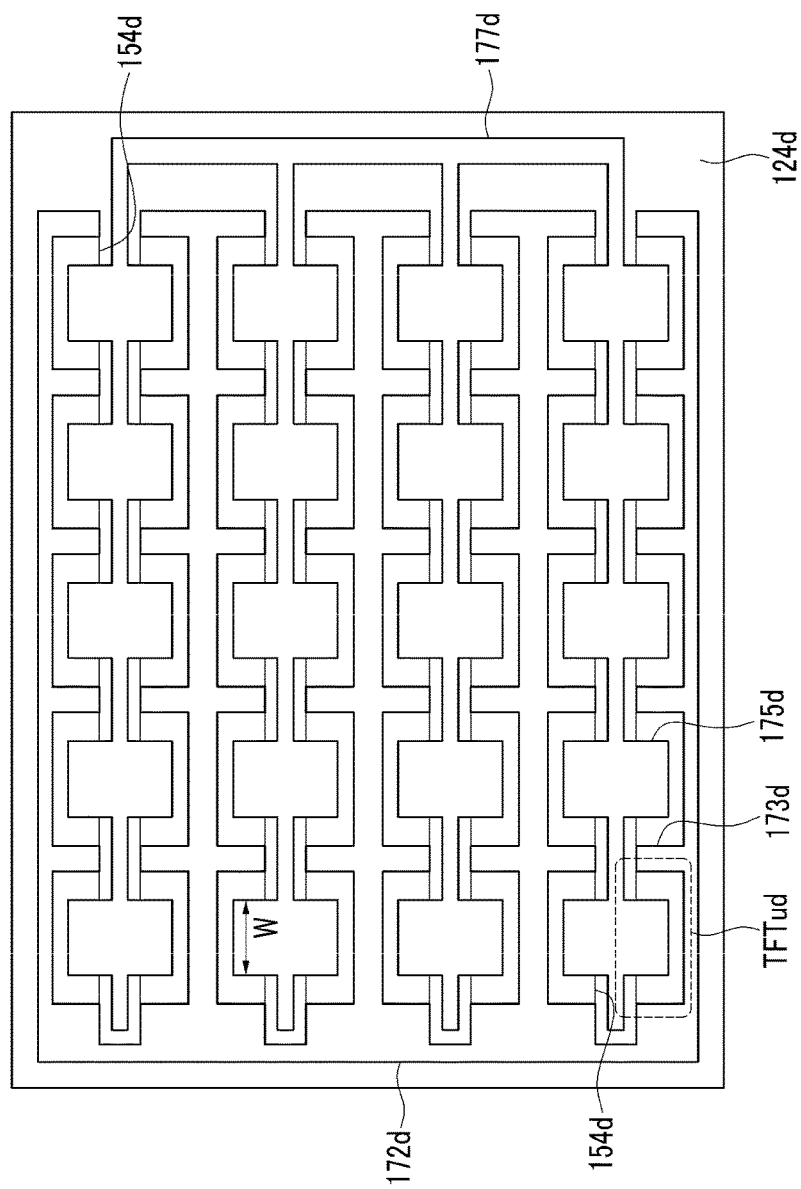

FIG. 18 is a layout view of a portion of a gate driver according to another exemplary embodiment. The exemplary embodiment of FIG. 18 has the same layered structure as the exemplary embodiment of FIG. 5 and FIG. 6.

A gate electrode 124d and a gate insulating layer 140 are sequentially formed on an insulation substrate 110, and a semiconductor 154d overlapping the gate electrode 124d is formed on the gate insulating layer 140. A pair of ohmic contact layers (not shown) that are separated from each other are formed on the semiconductor 154d, and a data conductor layer is formed thereon.

The data conductor layer includes a plurality of source electrodes 173d and a plurality of drain electrodes 175d.

The source electrodes 173d form a plurality of rows, and the source electrodes 173d are connected in each row. Also, the plurality of rows of the source electrodes 173d are electrically connected to each other through the connection.

The drain electrode 175d is enclosed by the source electrode 173d and is separated from the source electrode 173d. Each drain electrode 175d faces the source electrode 173d on the gate electrode 124d, and all drain electrodes 175d are connected through the connection 177d.

The gate electrode 124d, the source electrode 173d, and the drain electrode 175d form the unit transistor TFTud along with the semiconductor 154d, and all unit transistors TFTud are connected to each other thereby forming one transistor T1 having one function. Also, the gate electrode 124d and the source electrode 173d (including the interconnection areas of 173d between sub-transistors) overlapping the gate electrode 124d and having the gate insulating layer 140 disposed therebetween as a dielectric form the capacitor C1.

That is, in the present exemplary embodiment, the region of the transistor T1 and the region of the capacitor C1 are not separated from each other and are distributively formed together in one region. For this, the width W and the area of the source electrode 173d is wider than the width and the area of the source electrodes 173a, 173b, and 173c of the above described exemplary embodiments. For example, the area of all source electrodes 173d may be more than the area of all drain electrodes 175d by two times, and more preferably, by three times.

As described above, the region of the transistor T1 and the region of the capacitor C1 are not separated from each other and are formed in one region such that the deterioration of the gate driver due to the difference of the patterning density and the deviation according to the formation position may be removed in the manufacturing method of the gate driver.

In the exemplary embodiment of FIG. 16 to FIG. 18, the semiconductor or the semiconductive layer except for the channel portion has almost the same plane shape as the data conductor layer and the ohmic contact layer, however the present teachings are not limited thereto, and the semiconductor or the semiconductive layer may be formed by using a separate photomask from the data conductor layer.

The various characteristics of the exemplary embodiments of the present disclosure may be applied to various display devices and drivers having different structures.

As described above, when two circuit elements of the driver of the display device are formed in each region and the patterning density is generated, as an exemplary embodiment of the present teachings, the regions of two circuit elements are alternately disposed, the pattern having the density that is changed according to the position of the circuit element is formed, or two circuit elements are simultaneously formed in one region such that the deterioration of the driver due to the patterning density of two circuit elements and the characteristic deviation according to the position may be reduced.

While this disclosure of invention has been described in connection with what are presently considered to be practical exemplary embodiments, it is to be understood that the teachings provided herein are not limited to the disclosed embodiments, but, on the contrary, they intended to cover various modifications and equivalent arrangements included within the spirit and scope of the teachings.

What is claimed is:

1. A display device comprising:
   a display panel including a plurality of pixels and signal lines; and
   a driver, which is connected to the signal lines and includes a transistor and a capacitor electrically connected to the transistor,
   wherein
   the capacitor is adjacent to the transistor in a plan view,
   the capacitor includes a first conductive layer and a second conductive layer as two terminals of the capacitor, the first and second conductive layers overlapping each other with an insulating layer interposed between the first conductive layer and the second conductive layer,
   the second conductive layer includes at least one opening adjacent to the transistor, and
   the opening extends through the second conductive layer to a surface of the insulating layer and exposes a portion of the surface of the insulating layer, such that the portion of the surface of the insulating layer is not covered by the second conductive layer.

2. The display device of claim 1, wherein the second conductive layer includes a plurality of openings,
   the openings are spaced from each other, and
   some of the openings are arranged along and adjacent to the transistor.

3. The display device of claim 2, wherein the driver includes a gate driver having an output unit outputting a gate signal.

4. The display device of claim 1, wherein
   the second conductive layer is connected to a source electrode of the transistor.

5. The display device of claim 4, wherein the transistor includes a plurality of spaced apart sub-transistor units,
   sub-gate electrodes of the plurality of sub-transistor units are connected to each other,
   sub-source electrodes of the plurality of sub-transistor units are connected to each other, and
   sub-drain electrodes of the plurality of sub-transistor units are connected to each other.

6. The display device of claim 1, wherein
   the signal lines include gate lines for transmitting respective gate signals to the plurality of pixels, and
   the driver includes a gate driver including an output unit supplying the gate signals to the gate lines.

7. A display device comprising:
   a display panel including a plurality of pixels and signal lines; and
   a driver, which is connected to the signal lines and includes a transistor and a capacitor electrically connected to the transistor,
   wherein
   the capacitor is adjacent to the transistor in a plan view,
   the capacitor includes a first conductive layer and a second conductive layer overlapping each other with an insulating layer interposed between the first conductive layer and the second conductive layer,
   the second conductive layer includes a first portion and a second portion,
   the first portion has a first plurality of openings and is positioned between the second portion and the transistor,
   the second portion has a second plurality of openings, and
   a pattern density of all the openings at the second portion is less than a pattern density of all the openings at the first portion.

8. The display device of claim 7, wherein
   the second conductive layer is connected to a source electrode of the transistor, and
   the first conductive layer is connected to a gate electrode of the transistor.

9. The display device of claim 8, wherein the transistor includes a plurality of spaced apart sub-transistor units,
   sub-gate electrodes of the plurality of sub-transistor units are connected to each other,
   sub-source electrodes of the plurality of sub-transistor units are connected to each other, and
   sub-drain electrodes of the plurality of sub-transistor units are connected to each other.

10. The display device of claim 9, further comprising:
    an ohmic contact layer and a semiconductive layer positioned under the sub-source electrodes and the sub-drain electrodes of the plurality of sub-transistor units,
    wherein
    the ohmic contact layer and the semiconductive layer except for a channel portion have a same planar shape as the sub-source electrodes and the sub-drain electrodes.

11. The display device of claim 8, wherein
    the source electrode of the transistor is disposed at a same layer as the second conductive layer, and
    the gate electrode of the transistor is disposed at a same layer as the first conductive layer.

* * * * *